United States Patent
Strikovski et al.

(10) Patent No.: US 7,190,889 B2
(45) Date of Patent: Mar. 13, 2007

(54) NON-CONTACT HEATER AND METHOD FOR NON-CONTACT HEATING OF A SUBSTRATE FOR MATERIAL DEPOSITION

(75) Inventors: Mikhail Strikovski, Rockville, MD (US); Kolagani Solomon Harshavardhan, Ellicott City, MD (US)

(73) Assignee: Neocera, LLC, Beltsville, MD (US)

( * ) Notice: Subject to any disclaimer, the term of this patent is extended or adjusted under 35 U.S.C. 154(b) by 393 days.

(21) Appl. No.: 10/846,602

(22) Filed: May 17, 2004

(65) Prior Publication Data

US 2005/0253160 A1   Nov. 17, 2005

(51) Int. Cl.
*A21B 2/00*   (2006.01)
*F27D 11/00*  (2006.01)
*C23C 16/00*  (2006.01)

(52) U.S. Cl. .................... 392/416; 219/405; 118/725

(58) Field of Classification Search .............. 392/416, 392/417, 418, 407; 219/405, 402; 118/724, 118/725
See application file for complete search history.

(56) References Cited

U.S. PATENT DOCUMENTS

| | | | |
|---|---|---|---|
| 5,444,217 A * | 8/1995 | Moore et al. .............. 219/405 |
| 5,878,191 A * | 3/1999 | Miyashita et al. .......... 392/416 |
| 6,547,922 B2 * | 4/2003 | Hori et al. ............. 156/345.37 |
| 6,626,236 B1 * | 9/2003 | Bandoh et al. ............. 165/206 |
| 6,858,087 B2 * | 2/2005 | Hori et al. ................... 118/724 |
| 6,863,732 B2 * | 3/2005 | Asano et al. ................ 118/715 |

* cited by examiner

*Primary Examiner*—Daniel Robinson
(74) *Attorney, Agent, or Firm*—Rosenberg, Klein & Lee (57) ABSTRACT

A heater for the non-contact heating of an object, such as a substrate for material deposition, includes a housing defining a deposition cavity and a source of radiation outside the deposition cavity. A reflector is optically coupled to the source of radiation to collect the radiation and to focus it on the radiation path. The reflector may have different shapes. If, for example, the reflector is an ellipsoidal reflector, the source of radiation then is mounted in a first focus, the substrate is located in the other focus, and the radiation path is positioned on the main focal axis of the ellipsoidal reflector. The radiation from the source of radiation is delivered to the substrate inside the deposition cavity through a radiation path(s) formed in the housing wall to heat the substrate to the temperature $T_s$, so that $T_1 < T_s < T_2$, where $T_1$ is the temperature of the housing wall, while $T_2$ is the effective temperature of the source of radiation.

18 Claims, 6 Drawing Sheets

NON-CONTACT HEATER AND METHOD FOR NON-CONTACT HEATING OF A SUBSTRATE FOR MATERIAL DEPOSITION

FIELD OF THE INVENTION

The present invention relates to the non-contact heating of an object. The present invention is directed particularly to the heating of a substrate for thin film deposition in the absence of convective heating.

More particularly, the present invention relates to a system and method for the non-contact heating of a substrate positioned in a deposition cavity by optical radiation emanating from a radiation source located outside the walls of the deposition cavity in order to reach an optimal substrate temperature for material deposition.

BACKGROUND OF THE INVENTION

Non-contact (irradiative) heating is needed in the deposition of thin films onto a moving substrate in the absence of convective (gas) heating. It is customary to employ a cavity-type heater where a substrate is disposed in the cavity while the walls of the cavity-type heater are heated to a predetermined temperature $T_1$. In an ideal cavity, due to radiation exchange, the substrate may reach a temperature $T_s$ which is close to the temperature of the cavity walls, i.e., ($T_s \approx T_1$). The temperature $T_s$ of the heated substrate in the ideal cavity is theoretically uniform over the surface of the substrate and is stable.

In reality, however, the cavity walls have at least one opening formed therethrough to allow a deposition flux generated at the remote source of material into the cavity to reach the substrate for material deposition thereon.

Due to the presence of the opening in the walls of the cavity, a portion of the thermal energy of the substrate escapes from the cavity, thus causing a decrease of the substrate temperature $T_s$ below the temperature $T_1$ of the walls of the cavity ($T_s < T_1$).

In a non-ideal cavity, the temperature of the substrate will always be lower than the temperature of the walls. This causes unwanted obstacles in the deposition of high quality films of multi-component materials. Specifically, in the deposition of crystalline epitaxially grown films of a material, the surface of growth; e.g., substrate surface, must be heated to an optimal temperature that is close to but less than the temperature of decomposition $T_d$ of the material ($T_d \approx T_s$).

Thus, since $T_s < T_1$ and $T_d \approx T_s$, the wall temperature $T_1$ is higher than the decomposition temperature $T_d$ ($T_1 > T_d$). Under this condition, a fraction of the material passing into the cavity with the deposition flux (and unavoidably reaching the cavity walls) will decompose along with the material reaching the substrate. The re-evaporation of the material components from the walls will change the composition of the film growing on the substrate and, as a result, may degrade its properties.

Another technique customarily used to heat a substrate is radiation heating wherein a radiation from a remote source having an effective temperature $T_2 \gg T_s$, is directed onto the substrate. A laser or quartz halogen lamp may be used as the source of the radiation. Disadvantageously, the laser radiation of sufficient power (~0.5 kW for the substrates of reasonably large area ~10 cm$^2$) is relatively expensive to produce, and it is difficult to attain a uniform and stable temperature $T_s$ over the substrate area in the open heater arrangement.

The heater arrangements using lamps, in addition to high cost, require the lamps to be protected against the unwanted deposit of material. To lower the material deposited on the lamp surface, the lamps are usually distanced from the substrate, which requires radiation delivery optics, including focusing elements, mirrors, etc., resulting in further degradation of the uniformity and stability of the substrate temperature.

A technique for non-contact heating of a substrate for material deposition which provides stable and uniform heating of the substrate surface to a temperature satisfying the conditions required for multi-component films deposition is therefore needed in the industry.

SUMMARY OF THE INVENTION

It is an object of the present invention to provide a non-contact heater and a technique for the stable and uniform non-contact heating of a substrate surface to a temperature optimal for multi-component material deposition.

It is another object of the present invention to provide a non-contact heater built of a housing (where an object to be heated is positioned) and of a source of directed radiation positioned outside the housing. The radiation emanating from the source of directed radiation is delivered to the substrate through a small radiation path formed in the wall of the housing.

It is also an object of the present invention to provide a non-contact heater containing a cavity heater and a reflector housing forming an ellipsoidal reflector attached to the wall of the cavity heater. In such a heater, a source of radiation is positioned in the first focus of the ellipsoidal reflector, while the object to be heated is located in proximity to the second focus. The radiation emanating from the source of radiation is delivered therefrom to the object through the radiation path formed in the wall of the cavity heater. The radiation path is located on the main focal axis of the ellipsoidal reflector which connects the first and the second focuses thereof.

It is a further object of the present invention to provide a cavity heater with an additional source of radiation mounted remotely and isolated from the deposition cavity, in which the additional source of radiation is radiatively coupled to the substrate to attain a substrate temperature $T_s$, such that $T_1 < T_s < T_2$, where $T_1$ is the temperature of the walls of the deposition cavity, and $T_2$ is the effective temperature of the source of radiation.

It is an additional object of the present invention to provide a technique for the non-contact heating of a substrate for material deposition in which a substrate is positioned in a deposition cavity, where the walls are heated to a predefined temperature, and a deposition flux generated by a remote deposition source reaches the substrate through a deposition opening formed in the cavity walls. Further, additional radiation is delivered to the substrate from a remote source of optical radiation to stably and uniformly heat the substrate surface to a temperature exceeding the temperature of the walls of the cavity and below the effective temperature of the source of radiation.

It is still a further object of the present invention to provide a non-contact heater for a substrate and a technique for non-contact temperature measurement of the heated substrate using a spatially selective non-contact temperature sensor which is placed in the plane of the substrate image (created by radiation capturing optics) and which is sized to match the size of the image of the substrate area chosen to be used for temperature sensing.

The present invention provides for a non-contact heater system for heating an object, for example, a substrate for material deposition. The system includes a housing forming a deposition cavity defined by housing walls in which a flux opening and at least one radiation path are formed. The substrate is positioned inside the deposition cavity, while the flux opening is aligned with the deposition flux emanating from a deposition source disposed remotely from the deposition cavity in order to couple the deposition flux to the substrate.

The non-contact heater further includes a reflector for directing the radiation to the radiation path. The reflector may be arranged in several fashions. For example, it may be a planar mirror positioned behind the radiation source, or have a shape of rotational paraboloid, parabolic cylinder, etc. The reflector also may be shaped as an ellipsoidal reflector attached to the housing wall. The source of radiation is then positioned in a focus of the ellipsoidal reflector and radiatively coupled to the substrate in the deposition cavity. The substrate is positioned in proximity to the other focus of the ellipsoidal reflector. Preferably, for heating an extended substrate, the reflector is shaped as an elliptical cylinder.

The source of radiation is preferably optical in nature and is mounted outside the deposition cavity in the ellipsoidal reflector. The radiation source generates radiation which is delivered to the substrate to heat the substrate to a temperature above the temperature ($T_1$) of the housing wall of the deposition cavity but below the effective temperature ($T_2$) of the source of radiation. Preferably, a pair of radiation sources are positioned outside the deposition cavity, from which the radiation is coupled to the substrate through radiation paths formed in the housing wall. Each radiation path is located at the main focal axis of a respective ellipsoidal reflector between the focuses thereof.

The sources of radiation may include quartz halogen lamps positioned in ellipsoidal reflectors attached to the walls of the deposition cavity and in alignment with the radiation paths formed in the walls.

It is of particular importance that the source of radiation is preferably positioned at one focus of the ellipsoidal reflector, while the substrate is positioned in proximity to the other focus of the ellipsoidal reflector, and that the main axis of the ellipsoidal reflector extends through the radiation path formed in the housing wall. This arrangement allows for delivery of the radiation from the source of radiation to the substrate in the most effective manner with no need for fiber optics or other radiation delivery optics. The radiation sources are positioned off the axis of the deposition flux emanating from the deposition source and entering the deposition cavity in order to protect the sources of radiation from material deposition thereon.

The housing wall of the deposition cavity can be heated by heating elements such as, for example, a heater winding attached to the housing wall inside or outside the deposition cavity.

It is important to maintain the radiation paths, made in the housing wall of the deposition cavity, clear and optically transparent. For this purpose, deposition screens may be mounted inside the deposition cavity to prevent deposition of material on the radiation paths.

Additionally, the present invention is directed to a method for heating a substrate for material deposition which includes the steps of:

a) mounting a substrate in a deposition cavity defined by a housing wall, b) heating the housing wall to a temperature $T_1$, c) forming a flux opening and a radiation path in the housing wall of the deposition cavity, d) mounting radiation sources outside the deposition cavity. If the arrangement uses the ellipsoidal reflectors attached to the housing walls, then each source of radiation is mounted in one focus of the respective ellipsoidal reflector, while the substrate is located in the other focus (or in proximity of the other focus) thereof, and while the main focal axis of the ellipsoidal reflector extends through the radiation path formed in the housing wall; and, e) delivering the radiation emanating from the radiation sources to the substrate through the radiation paths formed in the housing wall of the deposition cavity to heat the substrate to a temperature $T_s$, where $T_s$ is above the temperature of the housing wall but below the effective temperature of the radiation source.

The method further includes the step of measuring the substrate temperature in a unique manner, including the steps of:

a) choosing an area S on the substrate, b) forming one or more holes in the housing wall, which are in direct communication with the area S on the substrate, c) positioning a lens (radiation capturing optics) against each of the holes to create an image of the area S in a predetermined plane outside the deposition cavity, and, d) positioning a radiation sensor in the predetermined plane and in alignment with the created image to sense and measure the radiation emanating from the area S. It is of great importance that the radiation sensor be sized to match the dimensions of the area S on the substrate.

These features and advantages of the present invention will be fully understood and appreciated from the following Figures outlined in the Detailed Description of the Accompanying Drawings.

DESCRIPTION OF THE PREFERRED EMBODIMENTS

The principles of the present inventive concept are applicable to the non-contact heating of any object, however, for purposes of a better understanding of the present invention, and as one of the examples of the particular application of the subject non-contact heating technique, the following description is directed primarily to the non-contact heating of a substrate for material deposition. As such, referring to FIGS. 1 and 2, a non-contact heater 10 includes a housing which has a deposition cavity 12 defined by a housing wall (or a cavity wall) 14, in which a deposition opening 16 and a pair of radiation paths 18 and 20 are formed. An object to be heated; e.g., a substrate 22, is mounted internal the deposition cavity 12 at a predetermined position therein. A deposition source 24 is mounted remotely from the deposition cavity 12 to generate a deposition flux 26, which enters the deposition cavity 12 through the deposition opening 16 for coating the substrate 22 to form crystalline films on the surface of the substrate 22. Sources of radiation 28 and 30 are positioned remote from the deposition cavity to generate optical radiation impinging on the surface of the substrate in order to uniformly and stably heat the substrate surface to an optimal temperature for multi-component material deposition.

Figure 1:
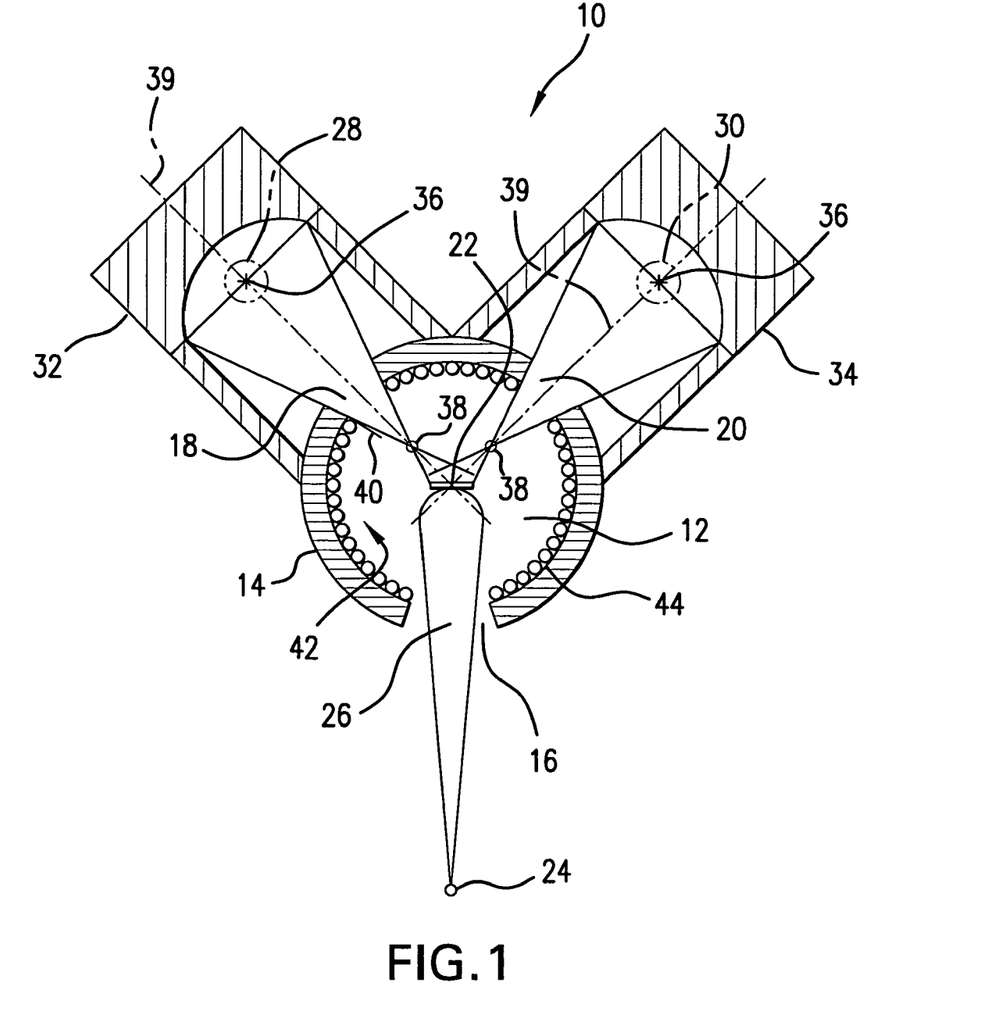
FIG. 1 is a schematic representation of a non-contact heater of the present invention with a pair of elliptical cylinder reflectors embedding radiation sources attached to the deposition cavity.
Figure 2:
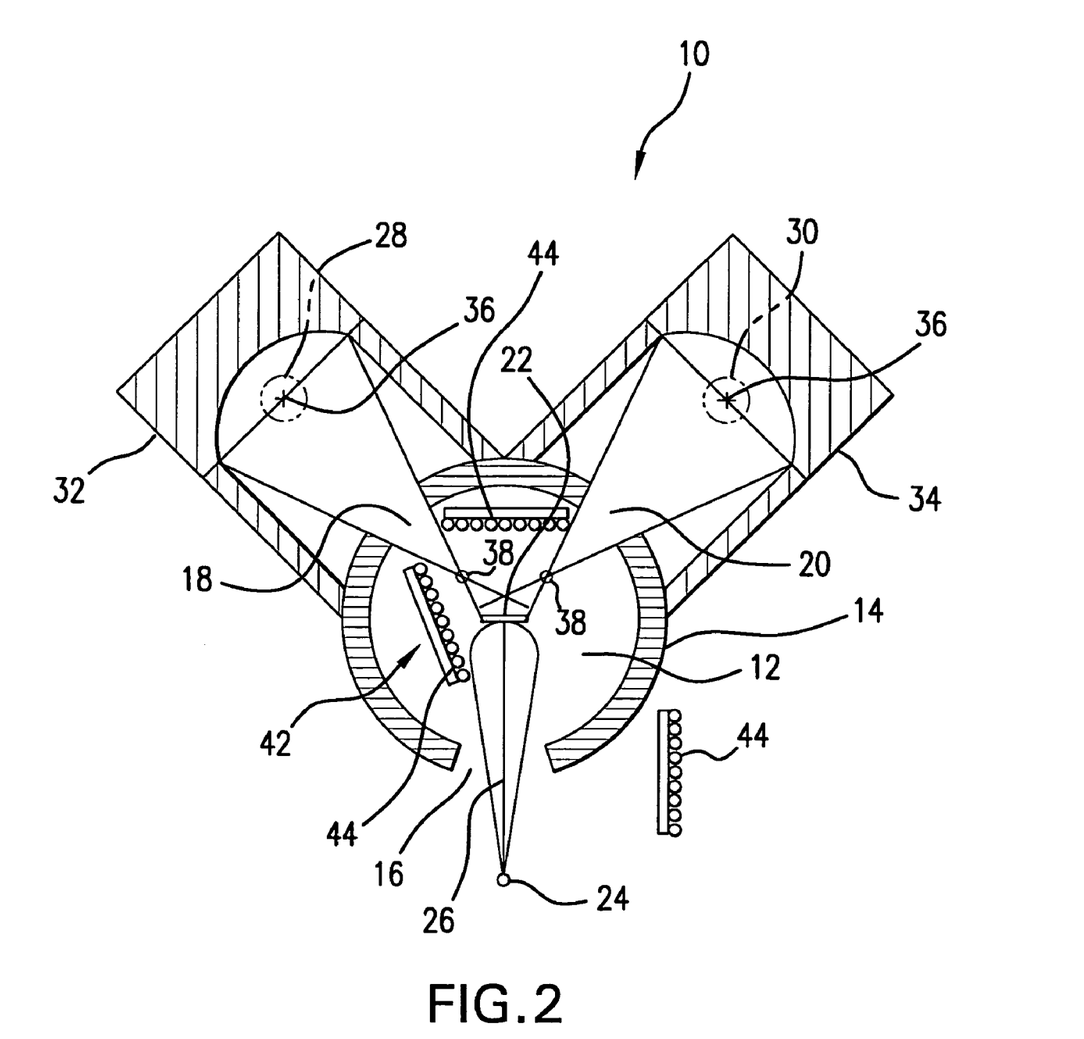
FIG. 2 is an alternative embodiment of the non-contact heater of the present invention with flat Thermocoax™ coils heating the walls of the deposition cavity.

Cylindrical ellipsoid reflectors 32 and 34 are coupled to the walls 14 of the deposition cavity 12 in precise registration with radiation paths 18 and 20, respectively. The sources of radiation 28 and 30 are located at the first focus 36 of the respective cylindrical ellipsoid reflectors 32 and 34. The cylindrical ellipsoidally-shaped reflectors 32 and 34 provide coupling of the sources of radiation 28 and 30 to the substrate 22. The inner surfaces of the reflectors 32 and 34 are coated with gold or a similar reflective coating which is substantially inert to prevent oxidation and degradation of its reflective qualities. The bodies of the cylindrical ellipsoid reflectors 32 and 34 are generally cooled through water cooling or a similar technique.

The radiation paths 18 and 20 define optically transmissive windows formed in the walls 14. By locating the sources of radiation 28 and 30 in the first focus 36 of the cylindrical ellipsoid reflectors 32 and 34, and by positioning the substrate near a second focus 38 of each reflector, the coupling between the radiation emanating from the sources 28 and 30 and the substrate is provided in the most optimal fashion through the radiation paths 18, 20, which are located on the main focal axis 39 of the respective ellipsoidal reflector.

Preferably, the radiation sources 28 and 30 are quartz halogen lamps which may, preferably, have a diameter of 8 mm. The radiation sources 28, 30 are located along the main focal axis of each reflector, preferably approximately 10 mm away from the nearest surface thereof. As shown in FIG. 1, the other foci 38 of the reflectors 32 and 34, respectively, are located between the substrate 22 and the ellipsoid foci 36, or coincide with the substrate 22. This mutual disposition between the radiation sources and the substrate minimizes the size of the radiation paths 18 and 20, thus improving the overall effectivity of the heater.

In order to keep the radiation paths 18 and 20 optically transmissive, which is necessary for direct radiative communication between the sources of radiation 28, 30 and the substrate 22, and to prevent them from accumulating the material conveyed into the deposition cavity 12 with the deposition flux 26, a deposition screen 40 may be mounted in proximity to the radiation paths 18 and 20.

Figure 3:
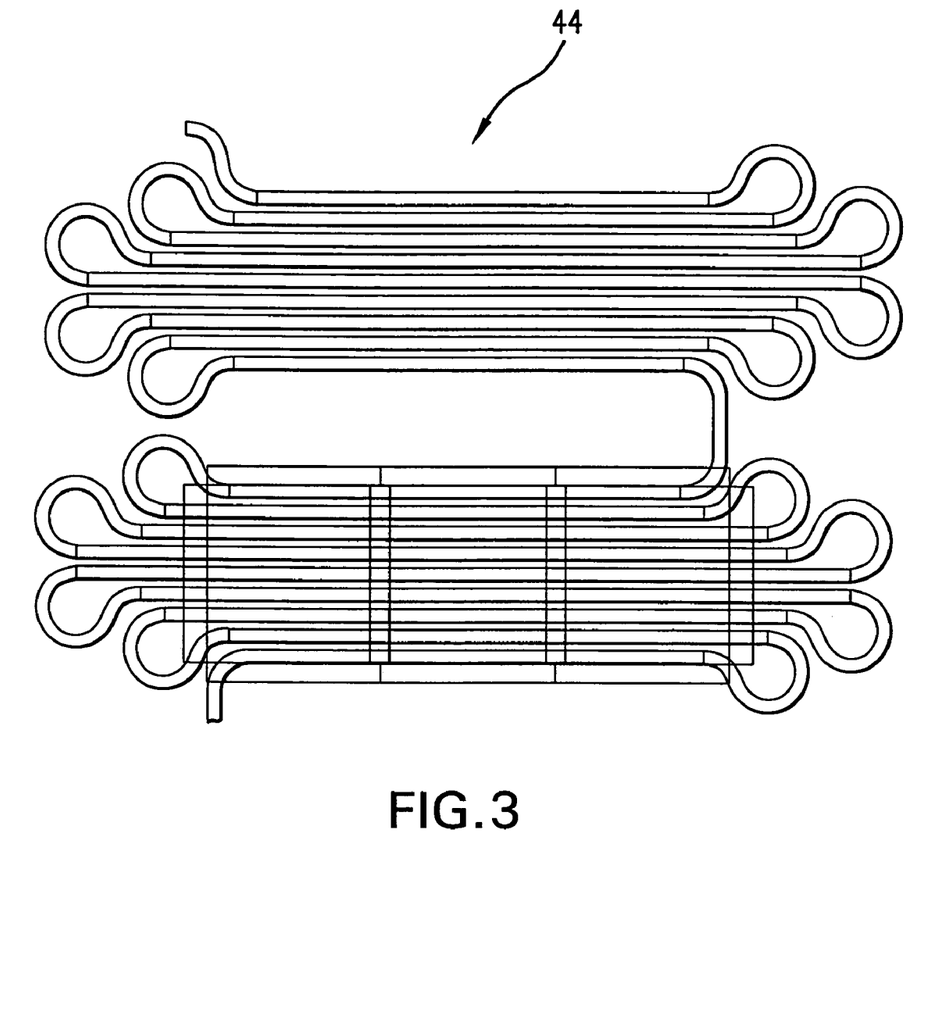
FIG. 3 illustrates an example of the Thermocoax™ winding having an exemplary Thermocoax™ bending configuration.

The walls 14 of the deposition cavity 12 are heated to a temperature $T_1$ by a heater which may be, for example, in the form of curved Thermocoax™ coils attached to the walls 14 inside (or outside) the deposition cavity 12, as shown in FIG. 1, or alternatively in the form of flat Thermocoax™ coils 42, as shown in FIG. 2. One of the possible configurations of the Thermocoax™ bent coil used in FIGS. 1 and 2, is shown in FIG. 3 which includes Thermocoax™ winding having the length of the wire in each section of ~950 mm and the diameter of the wire ~2 mm.

Although the heating elements described herein are Thermocoax™ heating elements, any suitable heating elements may be utilized. The Thermocoax™ heating elements of the preferred embodiment are screened electrical resistance wires of small diameter designed to be shaped and incorporated into heating systems. They consist of one or two straight current-carrying cores in a flexible metal sheath, electrically insulated from one another and from the sheath by means of a highly compacted refractory powder. The core is generally a nickel-chromium 80/20 composition, but may be formed or pure nickel, zirconium copper, or any other suitable materials. The insulator is generally a highly compacted mineral powder, generally formed of magnesium oxide. The sheath of the heating element may be formed of stainless steel or any other suitable material for the particular thermal qualities of the heating element. Thermocoax™ is a product of Thermocoax of Cedex, France.

The cavity heater 42, which heats the walls 14 to the temperature $T_1$, is formed by, for example, three sections of Thermocoax™ meander-like elements, with a diameter of the wire being ~2 mm with a length of 300 cm total, and a total resistance of 8.2 Ohm. With a maximum current of 15 amps through the element 44, the maximum power generated is $15^2 \times 8.2 = 1845$ W. One exemplary geometry of one section of the Thermocoax™ element 44 is shown in FIG. 3.

The non-contact heater 10 can be used for deposition of different films on the substrate 22. For example, the system may be used for deposition of films of high temperature superconductor, such as $Y-Ba_2-Cu_3-O_x$, which is a multicomponent material. This material requires a substrate temperature of ~800° C. to grow in usable crystalline form. However, this material decomposes at temperatures above 900° C. As the allowable temperature of the cavity wall 14 is limited to 900° C., the substrate temperature is limited to ~750° C. Additional heating, which is needed in order to reach the substrate temperature ~800° C., is provided by two cylindrical quartz halogen lamps placed off the deposition axis to minimize material deposit on the surfaces of the lamps. Cylindrical ellipsoidally shaped reflectors 32, 34 provide coupling of the lamps radiation to the substrate 22. The lamps 28 and 30 are located in the first focus 36 of the reflectors 32 and 34, while the substrate 22 is located near the second focus 38 of the reflectors 32, 34, as shown in FIGS. 1 and 2. The effective temperature of the lamps is ~1200° C., and their power is ~500 W, respectively.

Figure 6:
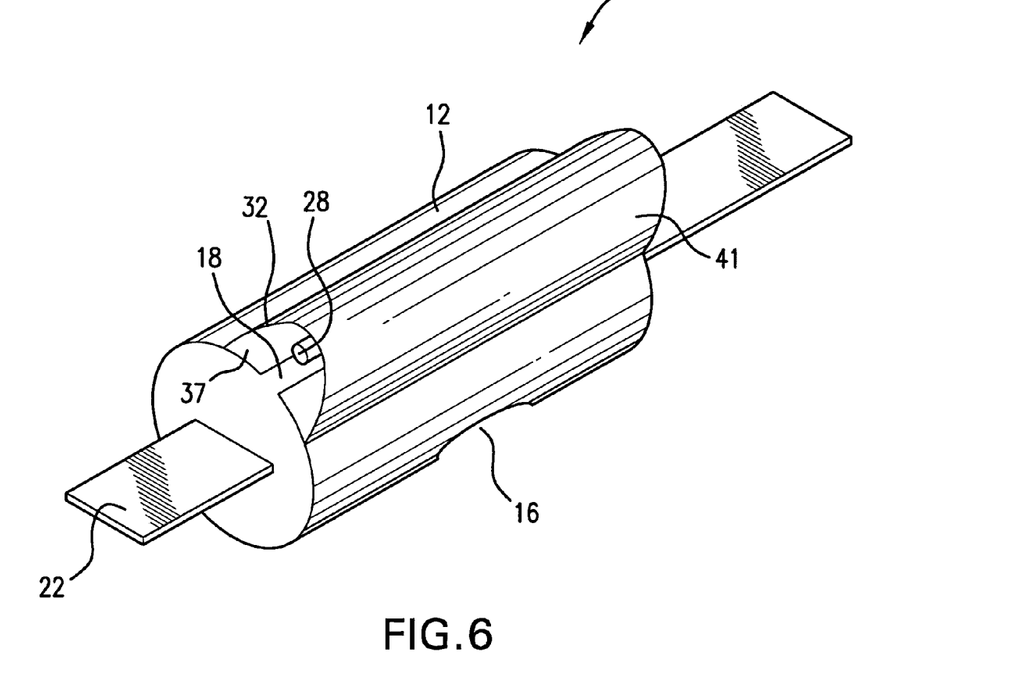
FIG. 6 is a prospective view of the non-contact heater of the present invention with parabolic cylinder reflector.

The non-contact heater 10 of the present invention is adaptable for a particularly important case of a tape-like substrate having a width of ~15 mm. In order to accommodate such a substrate, the shape of the deposition cavity 12 is elongated, as best shown in FIGS. 4 and 6, with a slot-like opening 16 for deposition.

Figure 4:
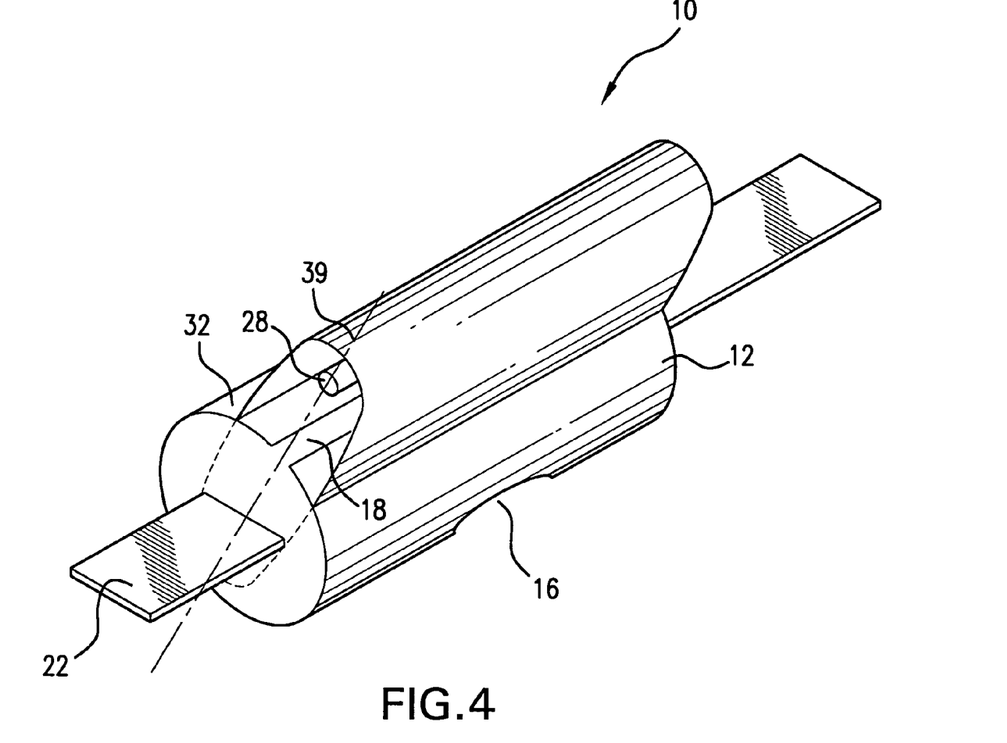
FIG. 4 is a prospective view of the non-contact heater of the present invention including the ellipsoidal cylinder reflector attached to the deposition cavity adapted for the tape-like substrate.

In FIG. 4, at least one elliptical cylinder reflector 32 (or 34) is attached to the wall 14 of the deposition cavity 12 so that the radiation emanating from the lamp 30 is delivered to the extended tape-like substrate 22 through the radiation path to heat the substrate to the optimal temperature.

Figure 5:
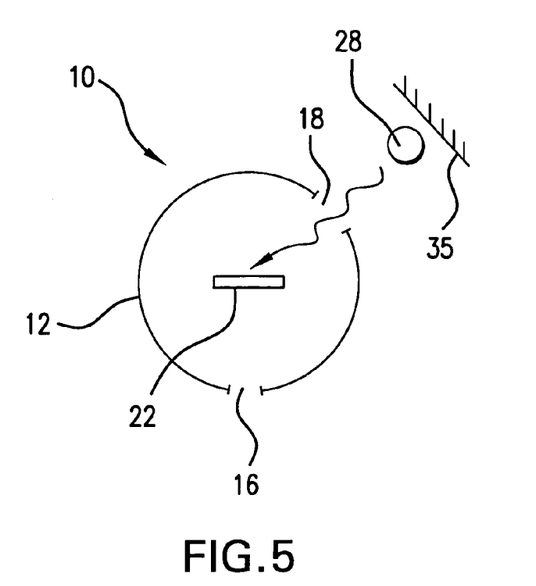
FIG. 5 shows schematically the non-contact heater of the present invention with the reflector including a planar mirror.

Although the non-contact heater of the present invention has been described supra with reference to FIGS. 1, 2, and 4 as having ellipsoidal type reflector, it has to be understood that other types of reflectors can be used in the arrangement of the present invention as well. The function of the reflector is to direct the radiation emanating from the radiation sources to the radiation paths formed in the cavity wall, so that the radiation could be delivered to the substrate for heating the same. For example, as shown in FIG. 5, the reflector can be arranged with a planar mirror 35 located behind the radiation source 28. In an alternative embodiment, shown in FIG. 6, the reflector may be formed as a cylindrical paraboloid 37. The radiation source will be located with focus of the paraboloid. In this arrangement the radiation is well collected. The paraboloid reflector shown in FIG. 6 is adapted for heating of the extended tape-like substrate, where the parabolic cylinder 41 is attached to the elongated cavity heater 12.

The temperature of the substrate 22 is controlled by balancing the power received from the source $P_{in}$ and the power lost due to radiation escaping external the system $P_{OUT}$; that is $P_{IN}=P_{OUT}$ ($T_s$). As the radiation losses are proportional to the fourth power of absolute temperature ($P_{OUT} \sim T^4$), a two times increase in total power $P_{IN}$ is capable of increasing the substrate temperature approximately $2^{1/4}=1.2$ times. A 2 inch long, cavity type heater with a power of 1000 W provides substrate temperature $T_s=700°$ C.=1000K. Thus, additional power of 1000 W from the remote source, with the two quartz halogen lamps and elliptical reflectors shown in FIGS. 1 and 2, can increase $T_s$ to 1000K×1.2=1200K=900° C., which is sufficient for deposition. The condition of $T_1<T_s<T_2$, where $T_s$ is the substrate temperature, $T_1$ is the temperature of the housing wall 14, and $T_2$ is the effective temperature of the source of radiation 28, 30, represents an optimal thermal condition for depositing high quality films of multicomponent material on the substrate 22. The non-contact measurements of the temperature $T_s$ of the substrate 22 was accomplished using infrared thermocouple detector (IR t/c.1x) manufactured by the Exergan Co. The non-contact measurements were performed using a measurement technique explained in detail infra with regard to FIGS. 7 and 8.

Due to the presence of the openings in the cavity wall, radiation of energy from the substrate via the openings results in a decrease of the substrate temperature $T_s$, and establishes a temperature difference of $T_1=T_s+\Delta$. The temperature of the wall of a real cavity (as opposed to an ideal cavity) is always higher than the temperature of the substrate. Not only is this disadvantageous for the quality of grown films, it also may be a problem for measurement/control over the substrate temperature, which must be non-contact (via radiation) as well. Radiation received by a detector can include a significant portion coming from "background" objects (objects other than the substrate). Given that the temperature of the cavity wall is greater ($\Delta$) than that of the substrate, the "parasitic" radiation can reduce the control sensitivity, as well as selectivity and quality thereof. This follows from the fact that the radiation intensity R is a strong function ($R \sim T^4$) of absolute temperature T, measured in K. Thus, even a small difference $\Delta$ in temperatures may result in a strong background radiation reading at the detector coming from the wall. The wall contribution is especially strong if the substrate material is transparent to the wall radiation ($Al_2O_3$, as an example). In this case, the sensor would sense the wall radiation passing through the substrate.

In the present invention, this problem is solved by employing a spatially selective, non-contact temperature measurement technique in order to reduce the undesirable contribution of the cavity wall radiation. A radiation receiver is placed in the plane of the substrate image (created by the radiation capturing optics, a lens for example) and is sized to match the dimensions of the image of the substrate area chosen to be used for the sensing. In this manner, the contribution of the substrate radiation in the overall radiation received is maximized and the noisy contribution of the radiation from the walls is minimized.

Figure 7:
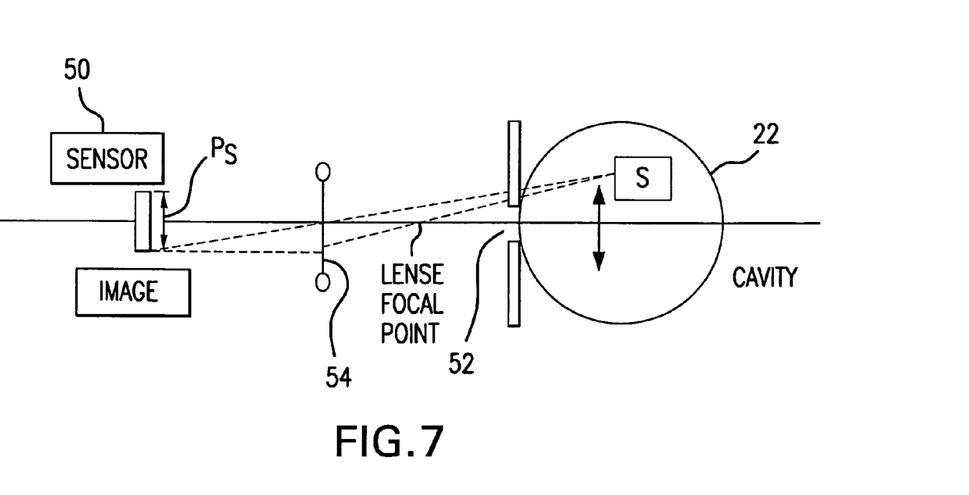
FIG. 7 is a schematic representation of a technique for non-contact measurement of the substrate temperature employed in the non-contact heater of the present invention.
Figure 8:
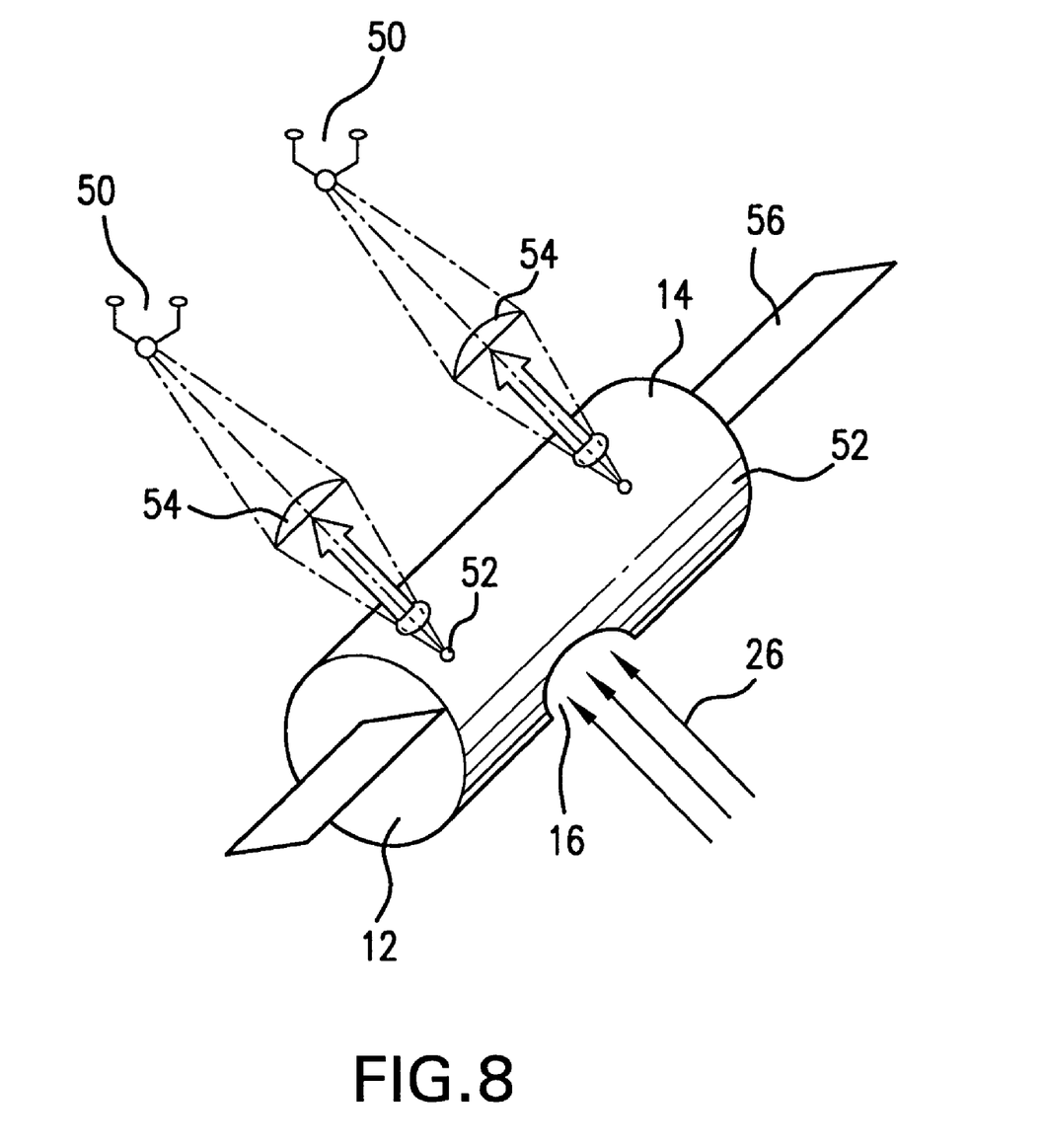
FIG. 8 shows schematically the non-contact heater of the present invention adapted for the tape-like substrate with a non-contact measurement arrangement.

As shown in FIGS. 7 and 8, non-contact measurement of the substrate temperature may be accomplished using a temperature sensor (a thermocouple, for example) 50 located outside the cavity 12 and optically coupled to the substrate surface via a small hole (or holes) 52 in the cavity wall 14.

FIGS. 7 and 8 illustrate the basic optical scheme of the measurement technique, where an area S on the substrate surface 22 is chosen to be used as a source of radiation for the sensing process. A lens 54 (made of Ge, for example) picks up and transports the radiation from the area S. In the plane $P_s$ of the area image, created by the lens, the radiation will have the greatest density (concentration). Other sources (background objects such as the housing wall 14, for example), located far from the substrate, will have their images in planes other than $P_s$. Accordingly, the density of their radiation in the plane $P_s$ will be reduced. Thus, for the sensor 50 located in the plane $P_s$, the total amount of picked-up radiation will have the greatest proportion (Radiation from substrate/Radiation from background) coming from the area S.

The size of the sensor element 50 has to match the size of the image from area S. In this manner, the sensor selectivity is improved, since it does not pick up radiation that comes from sources other than the S area. The field of view (FOV) of the optics should match the area S selected. Thus the effect of background radiation is reduced as well.

By using a thermocouple directly attached to the substrate, sensor calibration may be performed.

Referring specifically to FIG. 8, illustrating the design of the heater of the present invention adapted for the strip-type substrate 56, radiation from a small area on the surface of the heated strip 56 exits the deposition cavity 12 via small openings 52, and is focused by lenses 54 on the absorbing body of a thermocouple 50. The thermocouple temperature is calibrated relative to the temperature of the surface of the strip-type substate 56. Field of view (FOV) of the lens is selected to be limited to the small area on the strip (the thermocouple does not "sense" radiation coming from the cavity walls 14).

The measurements confirm that the non-contact heater of the present invention, which includes the semi-open cavity 12 having a wall temperature $T_1$ below the temperature of material deposition ($T_1<T_d$) in combination with at least one additional remote source of radiation, which has the effective temperature $T_2>T_1$ and is coupled to the substrate via the radiation delivery optics, provides the temperature condition of $T_1<T_s<T_2$, which is required for multi-component materials deposition as well as stability and uniformity of substrate heating.

Although this invention has been described in connection with specific forms and embodiments thereof, it will be appreciated that various modifications other than those discussed above may be resorted to without departing from the spirit or scope of the invention as defined in the appended claims. For example, equivalent elements may be substituted for those specifically shown and described, certain features may be used independently of other features, and in certain cases, particular locations of elements may be reversed or interposed, all without departing from the spirit or scope of the invention as defined in the appended claims.

What is claimed is:

1. A non-contact heater for heating an object, comprising:
a first housing having a housing wall defining and enveloping an internal cavity of said first housing, said housing wall being heated to a temperature $T_1$ and having at least one radiation path formed therein; and
at least one source of radiation with a predetermined effective temperature $T_2$ positioned external to said internal cavity of said first housing;
wherein the radiation emanating from said at least one source of radiation is delivered to an object positioned in said internal cavity through said at least one radiation path to heat the object to a temperature $T_s$, so that $T_1<T_s<T_2$, wherein $T_1$ is the temperature of said housing wall, $T_2$ is the predetermined effective temperature of said at least one source of radiation, and $T_s$ is the temperature of the object.

2. The non-contact heater of claim 1, further comprising reflector means optically coupled to said at least one source of radiation.

3. The non-contact heater of claim 2, wherein said reflector means is for directing the radiation emanating from said at least one source of radiation to said at least one radiation path formed in said housing wall.

4. The non-contact heater of claim 2, wherein said reflector means includes at least one second housing attached to said housing wall of said first housing, said at least one second housing having an internal surface forming an ellipsoidal reflector with a first focus positioned outside said internal cavity and with a second focus positioned in said internal cavity,
wherein said at least one source of radiation is positioned in said first focus of said ellipsoid reflector, the object is positioned in said internal cavity in proximity to said second focus of said ellipsoid reflector, and said at least one radiation path is positioned on a main focal axis of said ellipsoid reflector connecting said first and second focuses thereof.

5. The non-contact heater of claim 4, wherein said at least one second housing is shaped as an elliptical cylinder.

6. The non-contact heater of claim 2, wherein said reflector means includes at least one planar mirror located behind said at least one source of radiation.

7. The non-contact heater of claim 2, wherein said reflector means includes a reflective surface shaped to concentrate the radiation emanating from said at least one source of radiation on said at least one radiation path.

8. The non-contact heater of claim 2, wherein said reflector means includes a reflective surface shaped as a cylindrical paraboloid, said at least one source of radiation being positioned in the focus of said cylindrical paraboloid.

9. The non-contact heater of claim 8, wherein said reflector means further includes at least one reflector housing, said at least one reflector housing having an internal surface defining said reflective surface formed as said cylindrical paraboloid.

10. The non-contact heater of claim 1, wherein said object is a substrate for material deposition, and wherein said internal cavity is a deposition cavity, said housing wall further having a flux opening aligned with a deposition flux emanating from a deposition source disposed remotely from said deposition cavity to allow coupling between the deposition flux and the substrate mounted in said deposition cavity.

11. The non-contact heater of claim 1, further comprising a heating element thermally coupled to said housing wall to heat the housing wall to the temperature $T_1$.

12. The non-contact heater of claim 1, wherein said at least one source of radiation is a source of optical radiation.

13. The non-contact heater of claim 1, wherein said at least one source of radiation includes a quartz halogen lamp.

14. The non-contact heater of claim 10, further comprising an additional source of radiation mounted remotely from said deposition cavity and optically coupled to the substrate.

15. The non-contact heater of claim 14, wherein said housing wall further has an additional radiation path formed therein to provide radiation coupling between said additional source of radiation and the substrate.

16. The non-contact heater of claim 10, wherein said at least one source of radiation is positioned off-axis of said deposition flux.

17. The non-contact heater of claim 11, wherein said heating element includes at least one heater winding attached to said housing wall of said first housing.

18. The non-contact heater of claim 10, further comprising a deposition screen mounted in proximity to said at least one radiation path to prevent deposition of a material thereon.

* * * * *